(12) United States Patent
Miller et al.

(10) Patent No.: US 7,745,814 B2
(45) Date of Patent: Jun. 29, 2010

(54) POLYCHROMATIC LED'S AND RELATED SEMICONDUCTOR DEVICES

(75) Inventors: Thomas J. Miller, Woodbury, MN (US); Michael A. Haase, Saint Paul, MN (US); Xiaoguang Sun, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 35 days.

(21) Appl. No.: 11/009,241

(22) Filed: Dec. 9, 2004

(65) Prior Publication Data

US 2006/0124918 A1    Jun. 15, 2006

(51) Int. Cl.
*H01L 29/06*    (2006.01)
*H01L 27/15*    (2006.01)
(52) U.S. Cl. ................. 257/13; 257/14; 257/79
(58) Field of Classification Search .............. 257/12–15, 257/21, 22, 79, 89, 97, 186, 189, 191, 200, 257/85, 90, 96
See application file for complete search history.

(56) References Cited

U.S. PATENT DOCUMENTS

| 4,527,179 | A |   | 7/1985  | Yamazaki |         |
|-----------|---|---|---------|----------------|---------|
| 4,570,172 | A |   | 2/1986  | Henry et al.   |         |
| 4,688,068 | A | * | 8/1987  | Chaffin et al. | 136/249 |
| 5,646,419 | A |   | 7/1997  | McCaldin et al.|         |
| 5,751,014 | A |   | 5/1998  | Nakatsu et al. |         |
| 5,851,905 | A |   | 12/1998 | McIntosh et al.|         |
| 5,889,295 | A |   | 3/1999  | Rennie et al.  |         |
| 5,900,642 | A | * | 5/1999  | Nakatsu et al. | 257/25  |
| 5,998,925 | A |   | 12/1999 | Shimizu et al. |         |
| 6,147,365 | A |   | 11/2000 | Fischer et al. |         |
| 6,214,116 | B1| * | 4/2001  | Shin           | 118/640 |
| 6,265,734 | B1|   | 7/2001  | Fischer et al. |         |
| 6,303,404 | B1|   | 10/2001 | Moon et al.    |         |
| 6,337,536 | B1|   | 1/2002  | Matsubara et al.|        |
| 6,372,536 | B1|   | 4/2002  | Fischer et al. |         |

(Continued)

FOREIGN PATENT DOCUMENTS

EP    1 363 335 A2    11/2003

(Continued)

OTHER PUBLICATIONS

Damilano et al., "Monolithic White Light Emitting Diodes Based on InGaN/GaN Multiple-Quantum Wells", Japanese Journal of Applied Physics, vol. 40, No. 9, Sep. 15, 2001, pp. L918-L920.

(Continued)

*Primary Examiner*—Kenneth A Parker
*Assistant Examiner*—Joseph Nguyen
(74) *Attorney, Agent, or Firm*—Robert S. Moshrefzadeh

(57) ABSTRACT

A semiconductor device is provided comprising a first potential well located within a pn junction and a second potential well not located within a pn junction. The potential wells may be quantum wells. The semiconductor device is typically an LED, and may be a white or near-white light LED. The semiconductor device may additionally comprise a third potential well not located within a pn junction. The semiconductor device may additionally comprise absorbing layers surrounding or closely or immediately adjacent to the second or third quantum wells. In addition, graphic display devices and illumination devices comprising the semiconductor device according to the present invention are provided.

30 Claims, 3 Drawing Sheets

U.S. PATENT DOCUMENTS

| | | | |
|---|---|---|---|
| 6,504,171 | B1 | 1/2003 | Grillot et al. |
| 6,548,834 | B2 | 4/2003 | Sugawara et al. |
| 6,734,467 | B2 | 5/2004 | Schlereth et al. |
| 6,825,498 | B2 | 11/2004 | Lai et al. |
| 6,837,605 | B2 | 1/2005 | Reill |
| 7,064,354 | B2 | 6/2006 | Chen |
| 7,075,116 | B2 | 7/2006 | Okazaki |
| 7,119,487 | B2 | 10/2006 | Ikeda |
| 7,126,160 | B2 * | 10/2006 | Sun et al. ............... 257/98 |
| 7,129,526 | B2 | 10/2006 | Fujiwara |
| 7,141,445 | B2 | 11/2006 | Sugawara et al. |
| 7,223,998 | B2 | 5/2007 | Schwach et al. |
| 7,247,884 | B2 | 7/2007 | Shibata et al. |
| 7,402,831 | B2 | 7/2008 | Miller et al. |
| 2001/0042861 | A1 * | 11/2001 | Kano ................. 257/21 |
| 2002/0041148 | A1 | 4/2002 | Cho et al. |
| 2002/0134989 | A1 | 9/2002 | Yao et al. |
| 2002/0139984 | A1 * | 10/2002 | Sugawara et al. ......... 257/79 |
| 2002/0167014 | A1 | 11/2002 | Schlereth et al. |
| 2003/0006430 | A1 | 1/2003 | Shibata et al. |
| 2003/0026306 | A1 | 2/2003 | Ohkubo et al. |
| 2003/0161369 | A1 | 8/2003 | Chang et al. |
| 2004/0056256 | A1 * | 3/2004 | Bokor et al. ............ 257/79 |
| 2004/0061102 | A1 | 4/2004 | Tansu et al. |
| 2006/0076883 | A1 * | 4/2006 | Himaki et al. .......... 313/503 |
| 2006/0081858 | A1 * | 4/2006 | Lin et al. ............. 257/85 |

FOREIGN PATENT DOCUMENTS

| | | |
|---|---|---|
| EP | 1 381 091 A2 | 1/2004 |
| EP | 1 469 516 A1 | 10/2004 |
| JP | 11-274558 | 10/1999 |
| JP | 2004-072047 | 3/2004 |
| WO | WO 00/76005 | 12/2000 |
| WO | WO 01/66997 A2 | 9/2001 |
| WO | WO 02/097902 A1 | 12/2002 |

OTHER PUBLICATIONS

Yamada et al., "Phosphor Free High-Luminous-Efficiency White Light-Emitting Diodes Composed of InGaN Multi-Quantum Well", Japanese Journal of Applied Physics, vol. 41, No. 3A, Mar. 1, 2002, pp. L246-L248.

Dalmasso et al., "Injection Dependence of the Electroluminescence Spectra of Phosphor Free GaN-Based White Light Emitting Diodes", Physics Status Solidi (Sa) vol. 192, No. 1, Jul. 1, 2003, pp. 139-143.

Luo et al., "Patterned Three-Color ZnCdSe/ZnCdMgSe Quantum-Well Structures for Integrated Full-Color and White Light Emitters", Applied Physics Letters, vol. 77, No. 26, Dec. 25, 2000, pp. 4259-4261.

Herbert Kroemer, "Quantum Mechanics for Engineering, Materials Science and Applied Physics", (Prentice Hall, Englewood Cliffs, New Jersey), 1994, pp. 54-63.

Zory, ed., "Quantum Well Lasers", Academic Press, San Diego, California, 1993, pp. 72-79.

Reuscher et al., "ZnSe/BeTe Type-II Leds Emitting Between 640 and 515 nm", Journal of Crystal Growth, vols. 214/215, Jun. 11, 2000, pp. 1071-1074.

Chen, W. R. et al., "ZnSe-Based Mixed Color LEDs," IEEE Photonics Technology Letters, vol. 16, No. 5, May 2004, pp. 1259-1261.

Chen, W. R. et al., "ZnCdSeTe-Based Orange Light-Emitting Diode," IEEE Photonics Technology Letters, vol. 14, No. 8, Aug. 2002, pp. 1061-1063.

* cited by examiner

POLYCHROMATIC LED'S AND RELATED SEMICONDUCTOR DEVICES

FIELD OF THE INVENTION

This invention relates to semiconductor devices comprising potential well structures, typically quantum well structures, which may be LED's, including "white" or polychromatic LED's.

BACKGROUND OF THE INVENTION

Light emitting diodes (LED's) are solid-state semiconductor devices which emit light when an electrical current is passed between anode and cathode. Conventional LED's contain a single pn junction. The pn junction may include an intermediate undoped region; this type of pn junction may also be called a pin junction. Like non-light emitting semiconductor diodes, conventional LED's pass an electrical current much more readily in one direction, i.e., in the direction where electrons are moving from the n-region to the p-region. When a current passes in the "forward" direction through the LED, electrons from the n-region recombine with holes from the p-region, generating photons of light. The light emitted by a conventional LED is monochromatic in appearance; that is, it is generated in a single narrow band of wavelengths. The wavelength of the emitted light corresponds to the energy associated with electron-hole pair recombination. In the simplest case, that energy is approximately the band gap energy of the semiconductor in which the recombination occurs.

Conventional LED's may additionally contain one or more quantum wells at the pn junction which capture high concentrations of both electrons and holes, thereby enhancing light-producing recombination.

Several investigators have attempted to produce an LED device which emits white light, or light which appears white to the 3-color perception of the human eye.

Some investigators report the purported design or manufacture of LED's having multiple quantum wells within the pn junction, where the multiple quantum wells are intended to emit light at different wavelengths. The following references may be relevant to such a technology: U.S. Pat. No. 5,851,905; U.S. Pat. No. 6,303,404; U.S. Pat. No. 6,504,171; U.S. Pat. No. 6,734,467; Damilano et al., *Monolithic White Light Emitting Diodes Based on InGaN/GaN Multiple-Quantum Wells*, Jpn. J. Appl. Phys. Vol. 40 (2001) pp. L918-L920; Yamada et al., *Phosphor Free High-Luminous-Efficiency White Light-Emitting Diodes Composed of InGaN Multi-Quantum Well*, Jpn. J. Appl. Phys. Vol. 41 (2002) pp. L246-L248; Dalmasso et al., *Injection Dependence of the Electroluminescence Spectra of Phosphor Free GaN-Based White Light Emitting Diodes*, phys. stat. sol. (a) 192, No. 1, 139-143 (2003).

Some investigators report the purported design or manufacture of LED devices which combine two conventional LED's, intended to independently emit light at different wavelengths, in a single device. The following references may be relevant to such a technology: U.S. Pat. No. 5,851,905; U.S. Pat. No. 6,734,467; U.S. Pat. Pub. No. 2002/0041148 A1; U.S. Pat. Pub. No. 2002/0134989 A1; and Luo et al., *Patterned three-color ZnCdSe/ZnCdMgSe quantum-well structures for integrated full-color and white light emitters*, App. Phys. Letters, vol. 77, no. 26, pp. 4259-4261 (2000).

Some investigators report the purported design or manufacture of LED devices which combine a conventional LED element with a chemical phosphor, such as yttrium aluminum garnet (YAG), which is intended to absorb a portion of the light emitted by the LED element and re-emit light of a longer wavelength. U.S. Pat. No. 5,998,925 and U.S. Pat. No. 6,734,467 may be relevant to such a technology.

Some investigators report the purported design or manufacture of LED's grown on a ZnSe substrate n-doped with I, Al, Cl, Br, Ga or In so as to create fluorescing centers in the substrate, which are intended to absorb a portion of the light emitted by the LED element and re-emit light of a longer wavelength. U.S. Pat. No. 6,337,536 and Japanese Pat. App. Pub. No. 2004-072047 may be relevant to such a technology.

SUMMARY OF THE INVENTION

Briefly, the present invention provides a semiconductor device comprising a first potential well located within a pn junction and a second potential well not located within a pn junction. The potential wells are typically quantum wells. The semiconductor device is typically an LED. The semiconductor device may additionally comprise a third potential well not located within a pn junction. The semiconductor device may additionally comprise an absorbing layer surrounding or closely or immediately adjacent to the second potential well. Typically, the absorbing layer has an absorbing layer band gap energy less than or equal to the transition energy of the first potential well and greater than the transition energy of the second potential well. The semiconductor device may additionally comprise another absorbing layer surrounding or closely or immediately adjacent to the third potential well. Typically, the second absorbing layer has an absorbing layer band gap energy less than or equal to the transition energy of the first potential well and greater than the transition energy of the third potential well.

In one embodiment, the transition energy of the first potential well corresponds to green, blue or violet wavelength visible light, more typically blue or violet, the transition energy of the second potential well corresponds to yellow, green or blue wavelength visible light, more typically yellow or green, and the transition energy of the third potential well corresponds to red, orange or yellow wavelength visible light, more typically red or orange. In another embodiment, the transition energy of the first potential well corresponds to ultraviolet wavelength light and the transition energy of the second potential well corresponds to visible wavelength light. In another embodiment, the transition energy of the first potential well corresponds to visible wavelength light and the transition energy of the second potential well corresponds to infrared wavelength light.

In another aspect, the present invention provides a graphic display device comprising the semiconductor device according to the present invention.

In another aspect, the present invention provides an illumination device comprising the semiconductor device according to the present invention.

In this application:

with regard to a stack of layers in a semiconductor device, "immediately adjacent" means next in sequence without intervening layers, "closely adjacent" means next in sequence with one or a few intervening layers, and "surrounding" means both before and after in sequence;

"potential well" means a layer of semiconductor in a semiconductor device which has a lower conduction band energy than surrounding layers or a higher valence band energy than surrounding layers, or both;

"quantum well" means a potential well which is sufficiently thin that quantization effects raise the electron-hole pair transition energy in the well, typically having a thickness of 100 nm or less;

"transition energy" means electron-hole recombination energy;

"lattice-matched" means, with reference to two crystalline materials, such as an epitaxial film on a substrate, that each material taken in isolation has a lattice constant, and that these lattice constants are substantially equal, typically not more than 0.2% different from each other, more typically not more than 0.1% different from each other, and most typically not more than 0.01% different from each other; and "pseudomorphic" means, with reference to a first crystalline layer of given thickness and a second crystalline layer, such as an epitaxial film and a substrate, that each layer taken in isolation has a lattice constant, and that these lattice constants are sufficiently similar so that the first layer, in the given thickness, can adopt the lattice spacing of the second layer in the plane of the layer substantially without misfit defects.

It should be understood that, for any embodiment of the present invention described herein comprising n-doped and p-doped semiconductor regions, a further embodiment should be considered as disclosed herein wherein n doping is exchanged with p doping and vice-versa.

It should be understood that, where each of "potential well," "first potential well," "second potential well" and "third potential well" are recited herein, a single potential well may be provided or multiple potential wells, which typically share similar properties, may be provided. Likewise, it should be understood that, where each of "quantum well," "first quantum well," "second quantum well" and "third quantum well" are recited herein, a single quantum well may be provided or multiple quantum wells, which typically share similar properties, may be provided.

It is an advantage of certain embodiments of the present invention to provide an LED device capable of emitting polychromatic, white or near-white light.

DETAILED DESCRIPTION

The present invention provides a semiconductor device comprising a first potential well located within a pn junction and a second potential well not located within a pn junction. The potential wells are typically quantum wells. The semiconductor device is typically an LED. The LED typically is capable of emitting light at two wavelengths, one corresponding to the transition energy of the first potential well and a second corresponding to the transition energy of the second potential well. In typical operation, the first potential well emits photons in response to an electric current passing through the pn junction and the second potential well emits photons in response to the absorption of a portion of the photons emitted from the first potential well. The semiconductor device may additionally comprise one or more absorbing layers surrounding or closely or immediately adjacent to the second potential well. Absorbing layers typically have a band gap energy which is less than or equal to the transition energy of the first potential well and greater than that of the second potential well. In typical operation the absorbing layers assist absorption of photons emitted from the first potential well. The semiconductor device may comprise additional potential wells, located within the pn junction or located not within the pn junction, and additional absorbing layers.

The semiconductor device according to the present invention may be composed of any suitable semiconductors, including Group IV elements such as Si or Ge (other than in light-emitting layers), III-V compounds such as InAs, AlAs, GaAs, InP, AlP, GaP, InSb, AlSb, GaSb, and alloys thereof, II-VI compounds such as ZnSe, CdSe, BeSe, MgSe, ZnTe, CdTe, BeTe, MgTe, ZnS, CdS, BeS, MgS and alloys thereof, or alloys of any of the above. Where appropriate, the semiconductors may be n-doped or p-doped by any suitable method or by inclusion of any suitable dopant.

The semiconductor device according to the present invention may include a substrate. Any suitable substrate may be used in the practice of the present invention. Typical substrate materials include Si, Ge, GaAs, InP, sapphire, SiC, ZnSe, CdSe, ZnTe, GaSb and InAs. Most typically, the substrate is InP. The substrate may be n-doped, p-doped, or semi-insulating, which may be achieved by any suitable method or by inclusion of any suitable dopant. Alternately, the semiconductor device according to the present invention may be without a substrate. In one embodiment, the semiconductor device according to the present invention may be formed on a substrate and then separated from the substrate.

Figure 2:
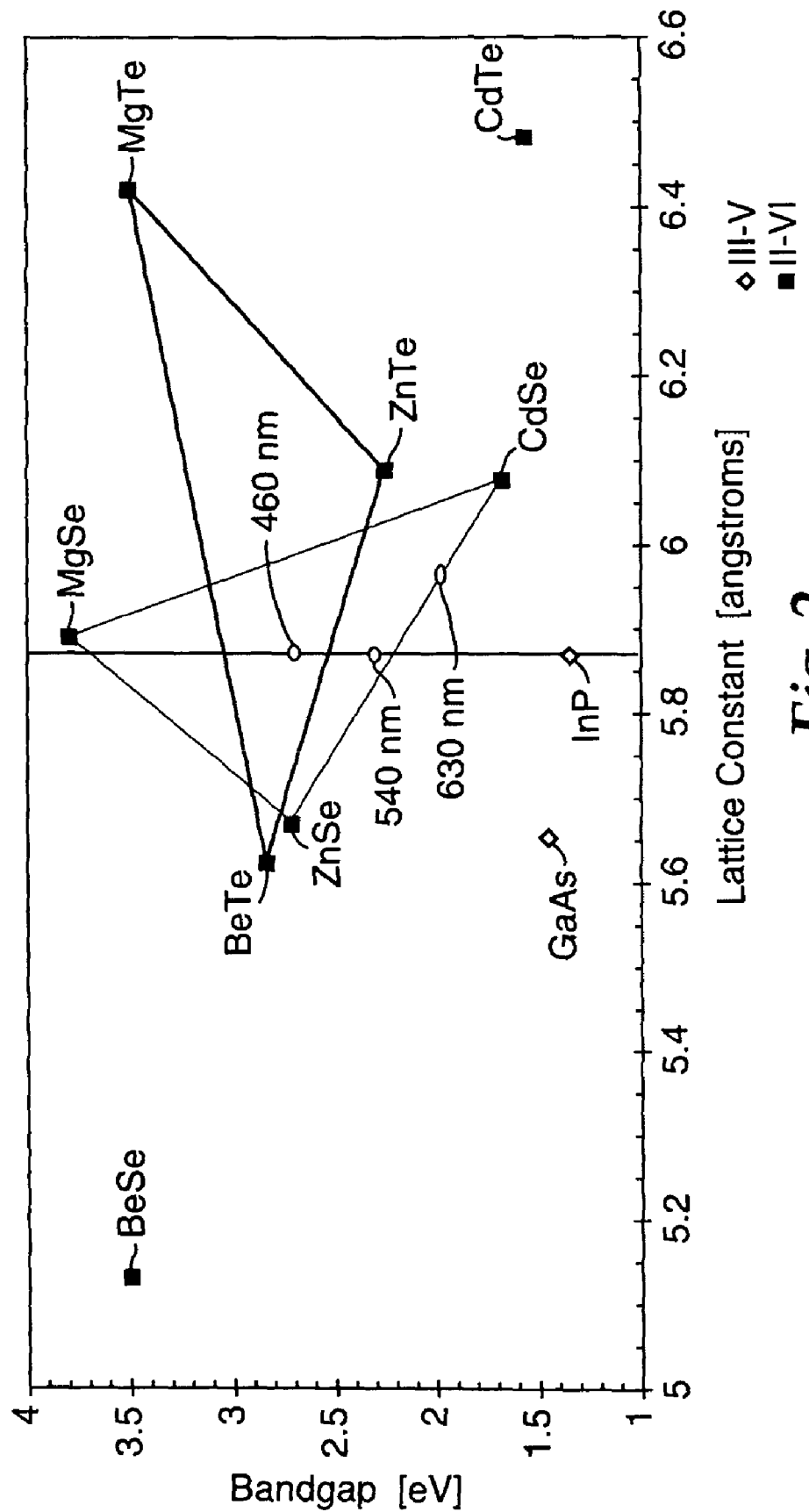
FIG. 2 is a graph indicating lattice constant and band gap energy for a variety of II-VI binary compounds and alloys thereof.

In one embodiment of the present invention, the compositions of the various layers of the semiconductor device are selected in light of the following considerations. Each layer typically will be pseudomorphic to the substrate at the thickness given for that layer or lattice matched to the substrate. Alternately, each layer may be pseudomorphic or lattice matched to immediately adjacent layers. Potential well layer materials and thicknesses are typically chosen so as to provide a desired transition energy, which will correspond to the wavelength of light to be emitted from the quantum well. For example, the points labeled 460 nm, 540 nm and 630 nm in FIG. 2 represent Cd(Mg)ZnSe alloys having lattice constants close to that for an InP substrate (5.8687 Angstroms or 0.58687 nm) and band gap energies corresponding to wavelengths of 460 nm (blue), 540 nm (green) and 630 nm (red). Where a potential well layer is sufficiently thin that quantization raises the transition energy above the bulk band gap energy in the well, the potential well may be regarded as a quantum well. The thickness of each quantum well layer will determine the amount of quantization energy in the quantum well, which is added to the bulk band gap energy to determine the transition energy in the quantum well. Thus, the wavelength associated with each quantum well can be tuned by adjustment of the quantum well layer thickness. Typically thicknesses for quantum well layers are between 1 nm and 100 nm, more typically between 2 nm and 35 nm. Typically the quantization energy translates into a reduction in wavelength of 20 to 50 nm relative to that expected on the basis of the band gap energy alone. Strain in the emitting layer may also change the transition energy for potential wells and quantum wells, including the strain resulting from the imperfect match of lattice constants between pseudomorphic layers. The materials which comprise the additional n-doped, p-doped or undoped (intrinsic) layers of the semiconductor device that do not comprise the potential wells or absorbing layers, including layers which make up the pn junction, typically are chosen to be transparent to the light generated by the LED. The thickness of these additional layers is typically much greater than that for the potential wells, typically at least 50 nm and up to 100 μm.

Techniques for calculating the transition energy of a strained or unstrained potential well or quantum well are known in the art, e.g., in Herbert Kroemer, *Quantum Mechanics for Engineering Materials Science and Applied Physics* (Prentice Hall, Englewood Cliffs, N.J., 1994) at pp. 54-63; and Zory, ed., *Quantum Well Lasers* (Academic Press, San Diego, Calif., 1993) at pp. 72-79; both incorporated herein by reference.

Any suitable emission wavelengths may be chosen, including those in the infrared, visible, and ultraviolet bands. In one embodiment of the present invention, the emission wavelengths are chosen so that the combined output of light emitted by the device creates the appearance of any color that can be generated by the combination of two, three or more monochromatic light sources, including white or near-white colors, pastel colors, magenta, cyan, and the like. In another embodiment, the semiconductor device according to the present invention emits light at an invisible infrared or ultraviolet wavelength and at a visible wavelength as an indication that the device is in operation. Typically the first potential well is associated with the highest transition energy (shortest wavelength), so that photons emitted from the first potential well have sufficient energy to drive other potential wells.

Figure 1:
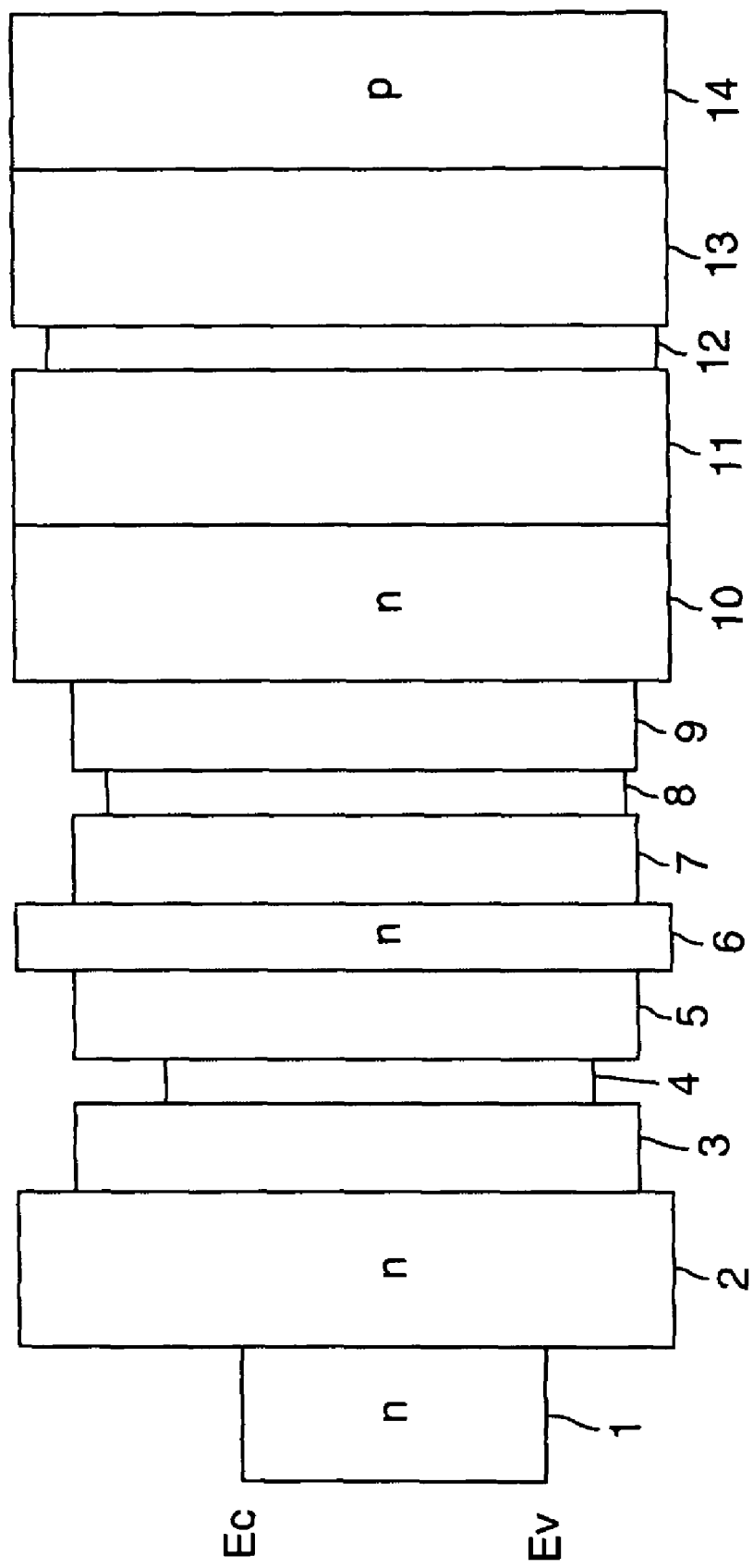
FIG. 1 is a flat-band diagram of conduction and valence bands of semiconductors in a construction according to one embodiment of the present invention. Layer thickness is not represented to scale.

FIG. 1 is a band diagram representing conduction and valence bands of semiconductors in a construction according to one embodiment of the present invention. Layer thickness is not represented to scale. Table I indicates the composition of layers 1-14 in this embodiment and the band gap energy ($E_g$) for that composition.

TABLE I

| Layer | Composition | Band gap Energy ($E_g$) |
|---|---|---|
| 1 | InP substrate | 1.35 eV |
| 2 | n-doped $Cd_{0.24}Mg_{0.43}Zn_{0.33}Se$ | 2.9 eV |
| 3 | $Cd_{0.35}Mg_{0.27}Zn_{0.38}Se$ | 2.6 eV |
| 4 | $Cd_{0.70}Zn_{0.30}Se$ | 1.9 eV |
| 5 | $Cd_{0.35}Mg_{0.27}Zn_{0.38}Se$ | 2.6 eV |
| 6 | n-doped $Cd_{0.24}Mg_{0.43}Zn_{0.33}Se$ | 2.9 eV |
| 7 | $Cd_{0.35}Mg_{0.27}Zn_{0.38}Se$ | 2.6 eV |
| 8 | $Cd_{0.33}Zn_{0.67}Se$ | 2.3 eV |
| 9 | $Cd_{0.35}Mg_{0.27}Zn_{0.38}Se$ | 2.6 eV |
| 10 | n-doped $Cd_{0.24}Mg_{0.43}Zn_{0.33}Se$ | 2.9 eV |
| 11 | undoped $Cd_{0.24}Mg_{0.43}Zn_{0.33}Se$ | 2.9 eV |
| 12 | $Cd_{0.31}Mg_{0.32}Zn_{0.37}Se$ | 2.7 eV |
| 13 | undoped $Cd_{0.24}Mg_{0.43}Zn_{0.33}Se$ | 2.9 eV |
| 14 | p-doped $Cd_{0.24}Mg_{0.43}Zn_{0.33}Se$ | 2.9 eV |

Layers 10, 11, 12, 13 and 14 represent a pn junction, or, more specifically, a pin junction, since intermediate undoped ("intrinsic" doping) layers 11, 12 and 13 are interposed between n-doped layer 10 and p-doped layer 14. Layer 12 represents a single potential well within the pn junction which is a quantum well having a thickness of about 10 nm. Alternately, the device may comprise multiple potential or quantum wells within the pn junction. Layers 4 and 8 represent second and third potential wells not within a pn junction, each being a quantum well having a thickness of about 10 nm. Alternatively, the device may comprise additional potential or quantum wells not within the pn junction. In a further alternative, the device may comprise a single potential or quantum well not within the pn junction. Layers 3, 5, 7 and 9 represent absorbing layers, each having a thickness of about 1000 nm. Electrical contacts, not shown, provide a path for supply of electrical current to the pn junction. Electrical contacts conduct electricity and typically are composed of conductive metal. The positive electrical contact is electrically connected, either directly or indirectly through intermediate structures, to layer 14. The negative electrical contact is electrically connected, either directly or indirectly through intermediate structures, to one or more of layers 1, 2, 3, 4, 5, 6, 7, 8, 9 or 10.

Figure 3:
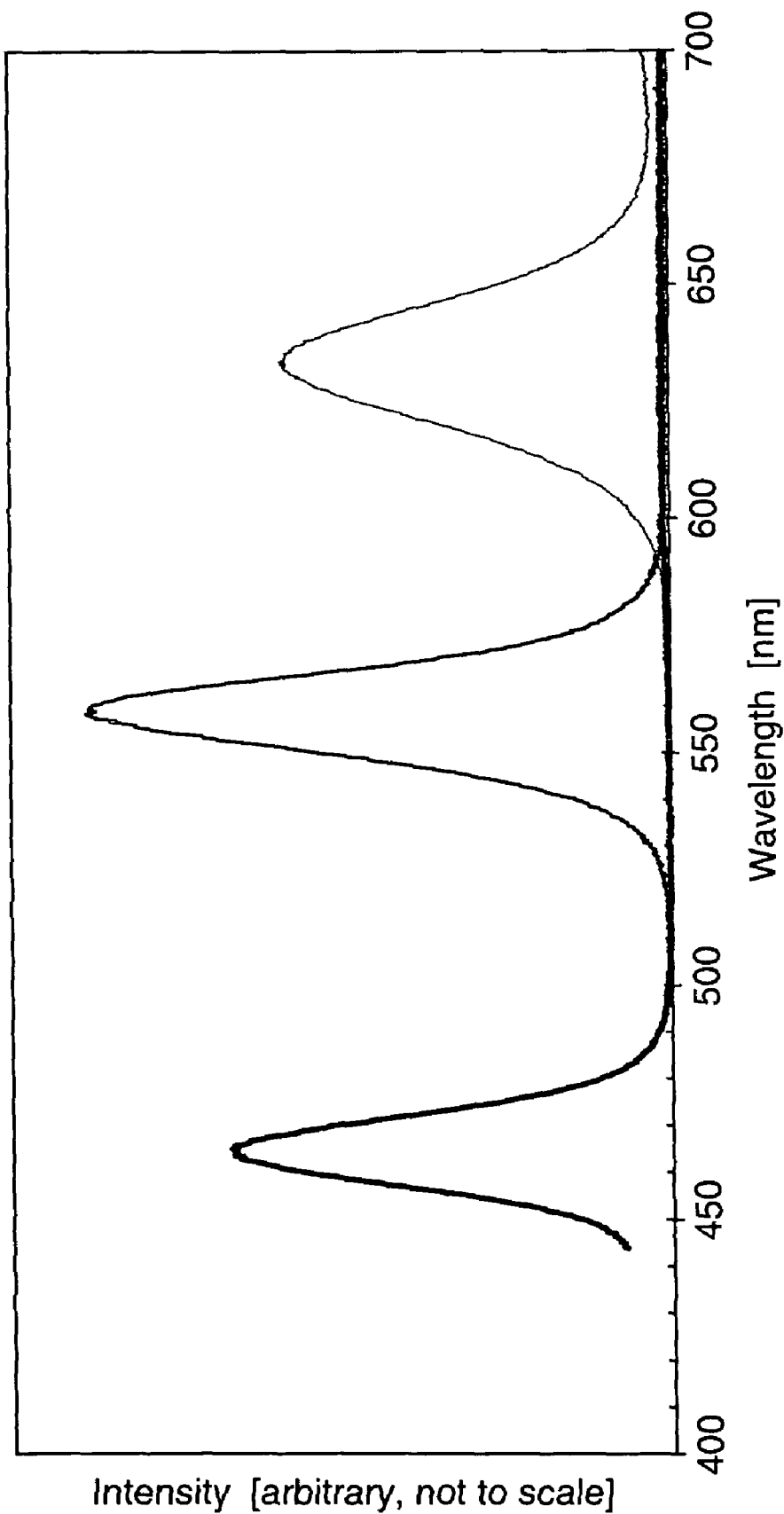
FIG. 3 is a graph representing the spectrum of light that emits from a device according to one embodiment of the present invention.

Without wishing to be bound by theory, it is believed that this embodiment of the present invention operates according to the following principles: When an electrical current passes from layer 14 to layer 10, blue-wavelength photons are emitted from quantum well (12) in the pn junction. Photons traveling in the direction of layer 14 may leave the device. Photons traveling in the opposite direction may be absorbed and re-emitted from the second quantum well (8) as green-wavelength photons or from the third quantum well (4) as red-wavelength photons. The absorption of a blue-wavelength photon generates an electron-hole pair which may then recombine in the second or third quantum wells, with the emission of a photon. Green- or red-wavelength photons traveling in the direction of layer 14 may leave the device. The polychromatic combination of blue-, green- and red-wavelength light emitted from the device may appear white or near-white in color. The intensity of blue-, green- and red-wavelength light emitted from the device may be balanced in any suitable manner, including manipulation of the number of potential wells of each type and the use of filters or reflective layers. FIG. 3 represents a spectrum of light that emits from one embodiment of the device according to the present invention.

Again with reference to the embodiment represented by FIG. 1, absorbing layers 3, 5, 7 and 9 may be especially suitable to absorb photons emitted from the first quantum well (12), since they have a band gap energy that is intermediate between the transition energy of the first quantum well (12) and those of the second and third quantum wells (8 and 4). Electron-hole pairs generated by absorption of photons in the absorbing layers 3, 5, 7 and 9 are typically captured by the second or third quantum wells 8 and 4 before recombining with concomitant emission of a photon. Absorbing layers may optionally be doped, typically like to surrounding layers, which in this embodiment would be n-doping. Absorbing layers may optionally have a gradient in composition over all or a portion of their thickness, so as to funnel or direct electrons and/or holes toward potential wells.

The semiconductor device according to the present invention may comprise additional layers of conducting, semiconducting or non-conducting materials. Electrical contact layers may be added to provide a path for supply of electrical current to the pn junction of the LED. Electrical contact layers may be placed such that the current supplied to the pn junction passes also through the potential wells that are not in the pn junction, or such that the current does not pass through potential wells that are not in the pn junction. Light filtering layers may be added to alter or correct the balance of light wavelengths in the light emitted by the device. To improve brightness and efficiency, layers comprising a mirror or reflector may be added behind the LED element, e.g., between the substrate and LED element, behind the substrate and LED element, within or comprising the substrate, or behind the LED after removal of the substrate.

In one embodiment, the semiconductor device according to the present invention is a white or near-white LED which emits light at four principal wavelengths in the blue, green, yellow and red bands. In one embodiment, the semiconductor device according to the present invention is a white or near-white LED which emits light at two principal wavelengths in the blue and yellow bands.

The semiconductor device according to the present invention may comprise additional semiconductor elements comprising active or passive components such as resistors, diodes, zener diodes, conventional LED's, capacitors, transistors, bipolar transistors, FET transistors, MOSFET transistors, insulated gate bipolar transistors, phototransistors, photodetectors, SCR's, thyristors, triacs, voltage regulators, and other circuit elements. The semiconductor device according to the present invention may comprise an integrated circuit. The semiconductor device according to the present invention may comprise a display panel or an illumination panel.

The layered construction according to the present invention may be manufactured by any suitable method, which may include molecular beam epitaxy (MBE), chemical vapor deposition, liquid phase epitaxy and vapor phase epitaxy.

The semiconductor device according to the present invention may be a component or the critical component of a graphic display device such as a large- or small-screen video monitor, computer monitor or display, television, telephone device or telephone device display, personal digital assistant or personal digital assistant display, pager or pager display, calculator or calculator display, game or game display, toy or toy display, large or small appliance or large or small appliance display, automotive dashboard or automotive dashboard display, automotive interior or automotive interior display, marine dashboard or marine dashboard display, marine interior or marine interior display, aeronautic dashboard or aeronautic dashboard display, aeronautic interior or aeronautic interior display, traffic control device or traffic control device display, advertising display, advertising sign, or the like.

The semiconductor device according to the present invention may be a component or the critical component of a liquid crystal display (LCD), or like display, as a backlight to that display. In one embodiment, the semiconductor device according to the present invention is specially adapted for use a backlight for a liquid crystal display by matching the colors emitted by the semiconductor device according to the present invention to the color filters of the LCD display.

The semiconductor device according to the present invention may be a component or the critical component of an illumination device such as a free-standing or built-in lighting fixture or lamp, landscape or architectural illumination fixture, hand-held or vehicle-mounted lamp, automotive headlight or taillight, automotive interior illumination fixture, automotive or non-automotive signaling device, road illumination device, traffic control signaling device, marine lamp or signaling device or interior illumination fixture, aeronautic lamp or signaling device or interior illumination fixture, large or small appliance or large or small appliance lamp, or the like; or any device or component used as a source of infrared, visible, or ultraviolet radiation.

Various modifications and alterations of this invention will become apparent to those skilled in the art without departing from the scope and principles of this invention, and it should be understood that this invention is not to be unduly limited to the illustrative embodiments set forth hereinabove.

We claim:

1. A semiconductor device comprising a first potential well located within a pn junction that emits light at a first wavelength when the pn junction is biased, a second potential well that emits light at a second wavelength in response to an absorption of at least a portion of light at the first wavelength, and a first absorbing layer closely adjacent to the second potential well and having a band gap energy less than or equal to a first transition energy of the first potential well and greater than a second transition energy of the second potential well.

2. The semiconductor device according to claim 1, wherein the absorbing layer is immediately adjacent to said second potential well.

3. The semiconductor device according to claim 2 wherein said first potential well is a quantum well and wherein said second potential well is a quantum well.

4. The semiconductor device according to claim 3 which is an LED.

5. The semiconductor device according to claim 2 which is an LED.

6. The semiconductor device according to claim 1 additionally comprising a third potential well that emits light at a third wavelength in response to an absorption of at least a portion of light at the first wavelength.

7. The semiconductor device according to claim 6 additionally comprising a second absorbing layer immediately adjacent to said third potential well and having a band gap energy less than or equal to the first transition energy and greater than a third transition energy of the third potential well.

8. The semiconductor device according to claim 7 wherein said first potential well is a quantum well, wherein said second potential well is a quantum well, and wherein said third potential well is a quantum well.

9. The semiconductor device according to claim 8 which is an LED.

10. The semiconductor device according to claim 7 which is an LED.

11. The semiconductor device according to claim 7 wherein said first transition energy corresponds to green, blue or violet wavelength visible light, wherein said second transition energy corresponds to yellow, green or blue wavelength visible light, wherein said third transition energy corresponds to red, orange or yellow wavelength visible light.

12. A liquid crystal display comprising the semiconductor device according to claim 11, wherein said first, second and third transition energies are matched to the color filters of the liquid crystal display.

13. The semiconductor device according to claim 7 wherein said first transition energy corresponds to blue or violet wavelength visible light, wherein said second transition energy corresponds to yellow or green wavelength visible light, wherein said third transition energy corresponds to red or orange wavelength visible light.

14. The semiconductor device according to claim 6 wherein said first potential well is a quantum well, wherein said second potential well is a quantum well, and wherein said third potential well is a quantum well.

15. The semiconductor device according to claim 14 which is an LED.

16. The semiconductor device according to claim 6 which is an LED.

17. The semiconductor device according to claim 6, wherein said third potential well is not within the pn junction.

18. The semiconductor device according to claim 1 wherein said first potential well is a quantum well and wherein said second potential well is a quantum well.

19. The semiconductor device according to claim 18 which is an LED.

20. The semiconductor device according to claim 1 which is an LED.

21. The semiconductor device according to claim 1 wherein said first transition energy corresponds to ultraviolet wavelength light and wherein said second transition energy corresponds to visible wavelength light.

22. The semiconductor device according to claim 1 wherein said first transition energy corresponds to visible wavelength light and wherein said second transition energy corresponds to infrared wavelength light.

23. A graphic display device comprising the semiconductor device according to claim 1.

24. An illumination device comprising the semiconductor device according to claim 1.

25. The semiconductor device according to claim 1 which is a magenta-emitting LED.

26. The semiconductor device according to claim 1 which is a cyan-emitting LED.

27. A liquid crystal display comprising the semiconductor device according to claim 1.

28. The semiconductor device according to claim 1, wherein said second potential well is not within the pn junction.

29. The semiconductor device according to claim 1, wherein said first potential well comprises a III-V compound and said second potential well comprises a II-VI compound.

30. The semiconductor device according to claim 1, wherein said second potential well comprises a Cd(Mg)ZnSe alloy.

* * * * *

UNITED STATES PATENT AND TRADEMARK OFFICE
CERTIFICATE OF CORRECTION

Page 1 of 1

PATENT NO. : 7,745,814 B2
APPLICATION NO. : 11/009241
DATED : June 29, 2010
INVENTOR(S) : Thomas James Miller It is certified that error appears in the above-identified patent and that said Letters Patent is hereby corrected as shown below:

Column 5,

Line 9, Delete "Engineering" and insert -- Engineering, --, therefor.

Line 62, Delete "Alternatively," and insert -- Alternately, --, therefor.

Signed and Sealed this
Eighth Day of February, 2011

David J. Kappos
*Director of the United States Patent and Trademark Office*

(12) EX PARTE REEXAMINATION CERTIFICATE (10363rd)

United States Patent
Miller et al.

(10) Number: US 7,745,814 C1
(45) Certificate Issued: Oct. 24, 2014

(54) POLYCHROMATIC LED'S AND RELATED SEMICONDUCTOR DEVICES

(75) Inventors: Thomas J. Miller, Woodbury, MN (US); Michael A. Haase, Saint Paul, MN (US); Xiaoguang Sun, Woodbury, MN (US)

(73) Assignee: 3M Innovative Properties Company, St. Paul, MN (US)

Reexamination Request:
No. 90/020,046, Nov. 19, 2013

Reexamination Certificate for:
Patent No.: 7,745,814
Issued: Jun. 29, 2010
Appl. No.: 11/009,241
Filed: Dec. 9, 2004

Certificate of Correction issued Feb. 8, 2011

(51) Int. Cl.
*H01L 29/06* (2006.01)
*H01L 27/15* (2006.01)

(52) U.S. Cl.
USPC .................... 257/13; 257/14; 257/79

(58) Field of Classification Search
None
See application file for complete search history.

(56) References Cited

To view the complete listing of prior art documents cited during the proceeding for Reexamination Control Number 90/020,046, please refer to the USPTO's public Patent Application Information Retrieval (PAIR) system under the Display References tab.

*Primary Examiner* — Erik Kielin

(57) ABSTRACT

A semiconductor device is provided comprising a first potential well located within a pn junction and a second potential well not located within a pn junction. The potential wells may be quantum wells. The semiconductor device is typically an LED, and may be a white or near-white light LED. The semiconductor device may additionally comprise a third potential well not located within a pn junction. The semiconductor device may additionally comprise absorbing layers surrounding or closely or immediately adjacent to the second or third quantum wells. In addition, graphic display devices and illumination devices comprising the semiconductor device according to the present invention are provided.

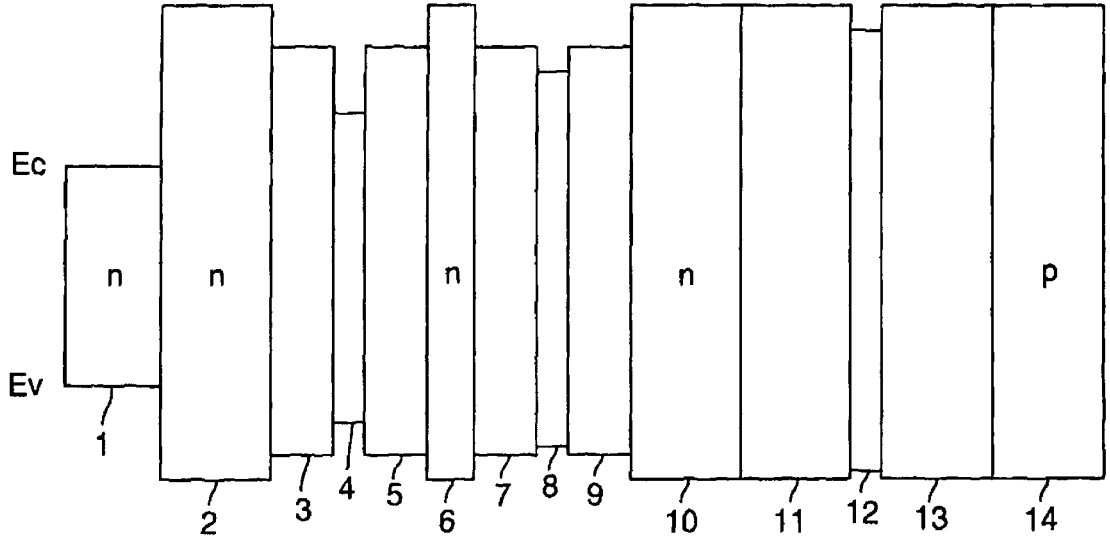

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-30 are cancelled.

\* \* \* \* \*